United States Patent [19]
Ke

[11] Patent Number: 6,108,807
[45] Date of Patent: Aug. 22, 2000

[54] APPARATUS AND METHOD FOR HYBRID PIN CONTROL OF BOUNDARY SCAN APPLICATIONS

[75] Inventor: Wuudiann Ke, Cupertino, Calif.

[73] Assignee: Lucent Technologies Inc., Murray Hill, N.J.

[21] Appl. No.: 08/901,250

[22] Filed: Jul. 28, 1997

(Under 37 CFR 1.47)

[51] Int. Cl.[7] .................................................. G01R 31/28
[52] U.S. Cl. ............................................................ 714/726
[58] Field of Search .................................. 714/724, 727, 714/726, 728, 729, 730, 731, 733, 734, 38, 5; 365/201; 324/158.1, 73.1

[56] References Cited

U.S. PATENT DOCUMENTS

| | | | |
|---|---|---|---|
| 4,835,414 | 5/1989 | Freidin ...................................... | 370/243 |
| 4,982,380 | 1/1991 | Koike ....................................... | 365/201 |
| 5,237,218 | 8/1993 | Josephson et al. ...................... | 307/465 |
| 5,412,260 | 5/1995 | Tsui et al. ........................... | 371/22.3 X |
| 5,490,151 | 2/1996 | Feger et al. .............................. | 371/22.3 |
| 5,574,850 | 11/1996 | Fandrich .............................. | 395/182.03 |
| 5,719,877 | 2/1998 | Warren .................................... | 371/22.3 |

*Primary Examiner*—Hoa T. Nguyen
*Attorney, Agent, or Firm*—Gibbons, Del Deo, Dolan, Griffinger & Vecchione

[57] ABSTRACT

In accordance with the present invention, an apparatus and method for implementing a new user-defined B-S instruction called PINCONTROL is disclosed. When PINCONTROL is in effect, an output pin can be configured to be either driving a constant 0, driving a 1, in the high-impedance (high-Z) state or in the control of system logic; and different pins of the same chips may assume different configurations depending on the content of the capture and update portion of the B-S register. This instruction provides an improved fault insertion capability. For example, if it is desired to inject a stuck-at-0 fault at pin p, pin p can be configured to drive a constant 0 while allowing other pins to function normally. A stuck-at-1 fault can also be injected by configuring pin p to drive a constant 0 while allowing other pins to function normally. An open fault can also be injected by configuring pin p into a high-impedance state. As will described, multiple faults of the same or different type may be injected, as can transient faults with different durations. This kind of fault insertion capability can be used to verify the fault-tolerant capability of a fault-tolerant system and for the verification of system diagnostics software.

17 Claims, 5 Drawing Sheets

APPARATUS AND METHOD FOR HYBRID PIN CONTROL OF BOUNDARY SCAN APPLICATIONS

FIELD OF THE INVENTION

The present invention relates to automatic testing procedures for integrated circuits, and more particularly to a unique pin control scheme for automatic testing using the boundary scan test architecture.

BACKGROUND OF THE INVENTION

Boundary scan is a structured test technique that was developed to test IC (integrated circuit) interconnects on PWBs (printed wire boards) when physical access is impossible, difficult, or impractical. Implementation of the boundary scan test technique requires that a shift register and latch be placed at the functional I/Os of an IC. Each I/O pin can be driven to a known state or the current logic level can be captured and scanned out via a four-wire serial bus. The test bus and protocol as well as the behavior of the boundary cells are defined in IEEE Std. 1149.1. This standard defines a standard test logic architecture for implementing boundary scan functions which can be included in an integrated circuit for the purpose of testing the interconnects to the integrated circuit, the integrated circuit itself, or other integrated circuits. The test architecture is defined to include a test access port (TAP) having connections for a test clock pin (TCK), a test mode select pin (TMS), a test data input pin (TDI) and a test data output pin (TDO). The test architecture also includes a TAP controller (boundary-scan state machine), all as shown in FIG. 1. Thus, as IC pin counts increase, pin spacing decreases, and pin accessibility disappears, boundary scan (B-S) is playing an increasing role in design verification, manufacturing, and the testing of new products.

At present boundary-scan (B-S) allows all pins of a B-S chip to be controlled uniformly by either system or B-S logic. The requirement that all pins are controlled by the same logic (that is, for the same chip, some pins cannot be controlled by system logic while others are controlled by B-S registers), however, limits B-S usage for many applications, for example, those applications requiring fault injection.

Recently, several references have demonstrated methods of using B-S for fault injection. For example, designs have been proposed by Chau, Savio in "Fault Injection Boundary Scan Design for Verification of Fault Tolerant Systems", *Proc. of International Test Conference*, October, 1994, pp. 677–681 to modify B-S circuitry to inject faults at individual pins, in which the value of the B-S register is used to determine if a fault is injected or not. In a first design, the faulty values to be injected must be identical which is a drawback in itself. In a second design, faulty values are the contents of a shift (capture) portion of the B-S register. There are two drawbacks in this design—first, when shifting faulty values into to the B-S register, the value of the output pins may be rippling, and second, when an update state is entered, the fault injection selection pattern, which is kept in the update portion of the B-S register, may be corrupted. In another reference, Nadeau-Dostie, B. et al., "A new hardware fault insertion scheme for system diagnostics verification", *Proc. of International Test Conference*, October, 1995, pp. 994–1002, an alternate fault injection method is proposed for system diagnostics verification. It achieves several improvements over the designs in Chau, but the area overhead can be as high as 50 to 100% depending on the pad type. There are also some compliance issues with the IEEE 1149.1 standard.

Accordingly, in order to improve fault generation techniques, and to simplify test generation for inter-chip path delay testing, a need exists to provide for mixed control of pins in boundary scan applications.

SUMMARY OF THE INVENTION

The present invention teaches a scheme for providing hybrid pin control of output pins on an IC in the context of the boundary-scan (B-S) test architecture so that different pins of the same chip can be individually configured to be controlled by either system or B-S logic. In accordance with the present invention, an apparatus and method for implementing a new user-defined B-S instruction called PINCONTROL is disclosed. When PINCONTROL is in effect, an output pin can be configured to be either driving a constant 0, driving a 1, in the high-impedance (high-Z) state or in the control of system logic; and different pins of the same chips may assume different configurations depending on the content of the capture and update portion of the B-S register. This instruction provides an improved fault insertion capability. For example, if it is desired to inject a stuck-at-0 fault at pin p, pin p can be configured to drive a constant 0 while allowing other pins to function normally. An stuck-at-1 fault can also be injected by configuring pin p to drive a constant 1 while allowing other pins to function normally. An open fault can also be injected by configuring pin p into a high-impedance state. Multiple faults of the same or different type may be injected, as can transient faults with different durations. This kind of fault insertion capability can be used to verify the fault-tolerant capability of a fault-tolerant system and for the verification of system diagnostics software.

BRIEF DESCRIPTION OF THE FIGURES

For a better understanding of the present invention, reference is made to the following description of exemplary embodiments thereof, considered in conjunction with the accompanying drawings, in which.

DETAILED DESCRIPTION OF THE DRAWINGS

The present invention teaches a scheme for providing hybrid pin control of output pins on an IC in the context of the boundary-scan (B-S) test architecture so that different pins of the same chip can be individually configured to be controlled by either system or B-S logic. This kind of pin-level control is not defined in the IEEE 1149.1 standard and its unavailability has limited B-S applications. Since IEEE 1149.1 Boundary-Scan Architecture not only provides chip-level pin accessibility, but also an integrated infrastructure for users to define and add their own instructions and test data registers, implementation of hybrid pin control within the B-S architecture may be practically provided in order to offer significant additional test techniques to boundary scan users.

In accordance with the present invention, an apparatus and method for implementing a new user-defined B-S instruction called PINCONTROL is disclosed. When PINCONTROL is in effect, an output pin can be configured to be either driving a constant 0, driving a 1, in the high-impedance (high-Z) state or in the control of system logic; and different pins of the same chips may assume different configurations depending on the content of the capture and update portion of the B-S register. This instruction provides an improved fault insertion capability. For example, if it is desired to inject a stuck-at-0 fault at pin p, pine p can be configured to drive a constant 0 while allowing other pins to function normally. A stuck-at-1 fault can also be injected by configuring pin p to drive a constant 1 while allowing other pins to function normally. An open fault can also be injected by configuring pin p into a high-impedance state. As will be described, multiple faults of the same or different type may be injected, as can transient faults with different durations. This kind of fault insertion capability can be used to verify the fault-tolerant capability of a fault-tolerant system and for the verification of system diagnostics software.

Figure 2:
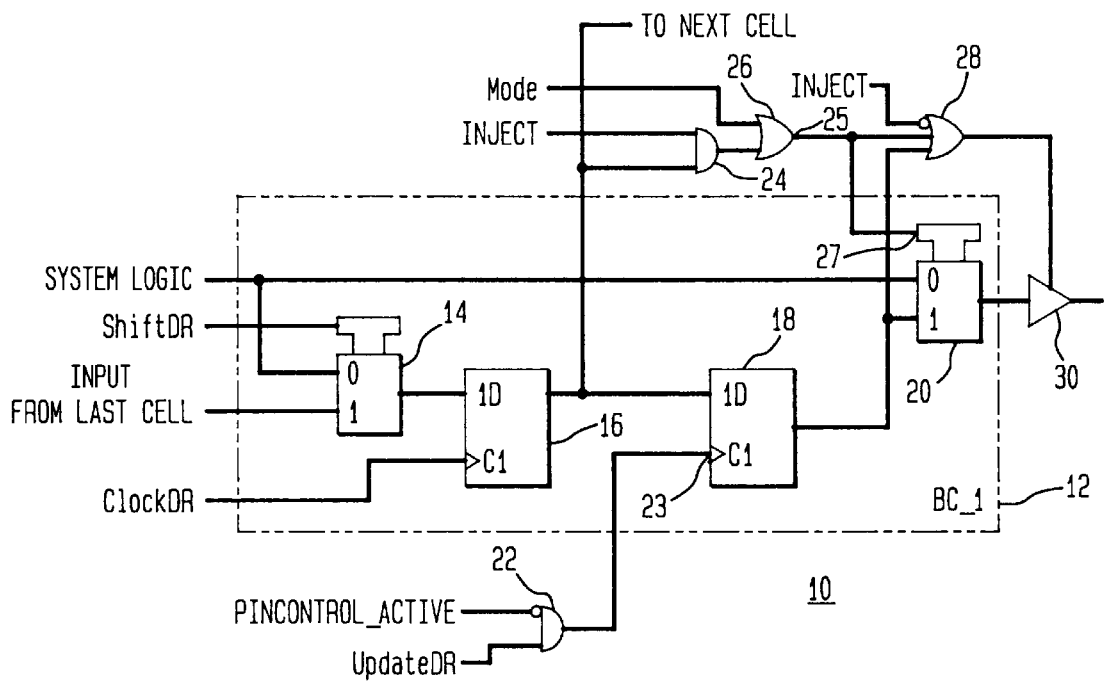
FIG. 2 shows one exemplary embodiment for implementation of the hybrid pin control feature using a common boundary scan cell in accordance with the present invention.

Referring FIG. 2, an exemplary modified boundary scan cell 10 for implementing the hybrid pin control feature is shown in accordance with the present invention. The modified boundary scan cell 10 incorporates one version of a traditional boundary scan (B-S) cell 12 which is defined in IEEE Standard 1149.1. This cell is used as an example because it is a common cell design. Implementation of the hybrid pin control feature of the present invention can be accomplished in a similar way, however, for different cell types, as would be understood by a person skilled in the art. As shown, the traditional B-S cell for an output pin includes an input shift register 14, a capture (CAP) flip-flop 16, an update (UPD) flip-flop or latch 18 and an output shift register 20. The traditional B-S cell 12 operates in accordance with the well known IEEE Std. 1149.1 which is incorporated by reference and therefore need not be described in greater detail at this point.

In order to implement the hybrid pin control or PINCONTROL feature of the present invention some additional gates are added to the B-S cell 12, where FIG. 2 shows one possible implementation. As shown, an AND gate 22 couples to the clock input 23 of the UPD flip flop 18. An output 25 of an AND gate 24 and OR gate 26 combination couples to an input 27 of the output shift register 20. This same output 25 couples to the input of another OR gate 28, the output of which controls a tri-state buffer 30. The output of the UPD flip-flop 18 also couples to the input of the OR gate 28 and to an input of the output shift register 20.

Two new control signals are also introduced—PINCONTROL_ACTIVE and INJECT which act as inputs to various ones of the newly added gates in the modified B-S cell 10. When PINCONTROL is in effect, an output pin can be configured in one of four possible states depending on values in the CAP and UPD flip-flops 16, 18. Table 1 shows the four combinations of CAP and UPD, and their corresponding configurations. If the CAP flip-flop 16 has value 1, the corresponding output pin is driven by the UPD flip-flop 18. If the CAP flip-flop has value 0, then the pin is driven by system logic if UPD 18 is 1, or the pin is in the High-Z state if UPD is 0.

TABLE 1

States of Output Pin under PINCONTROL

| CAP | UPD | States |
| --- | --- | --- |
| 1 | 1 | Driven by a constant 1. |
| 1 | 0 | Driven by a constant 0. |
| 0 | 1 | Driven by system logic. |
| 0 | 0 | In the High-Z state. |

Figure 1:
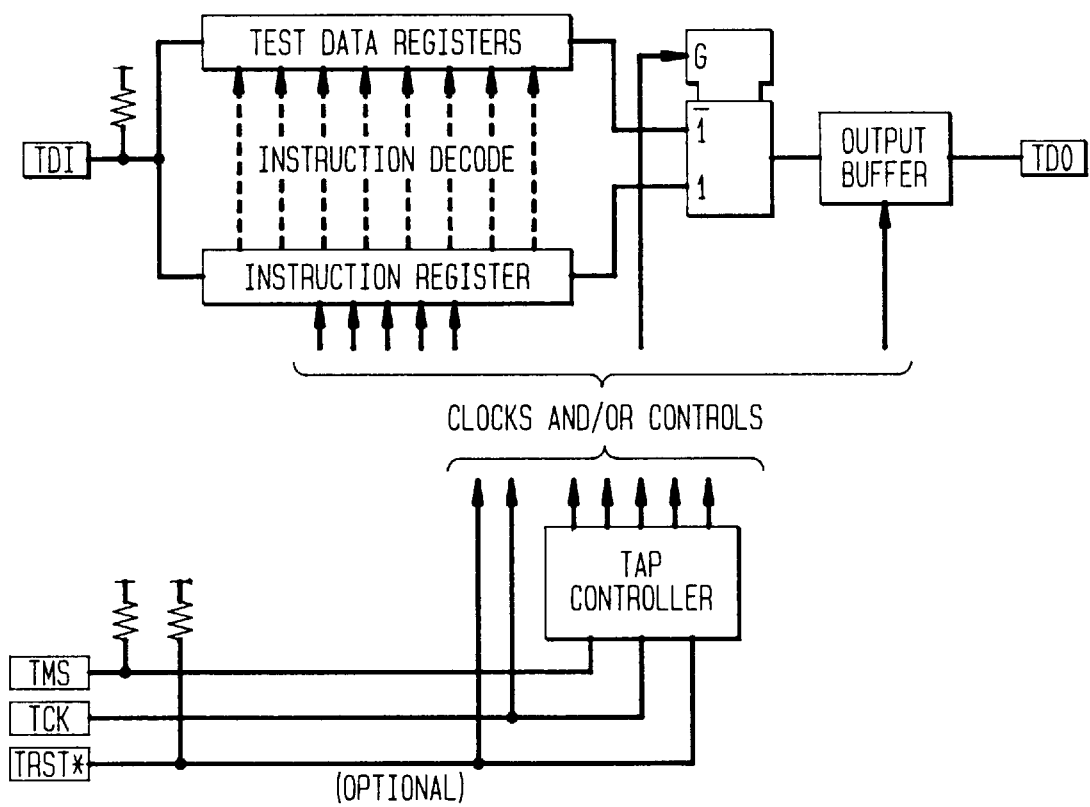
FIG. 1 shows a block diagram of the boundary scan test logic according to IEEE Standard 1149.1.
Figure 3:
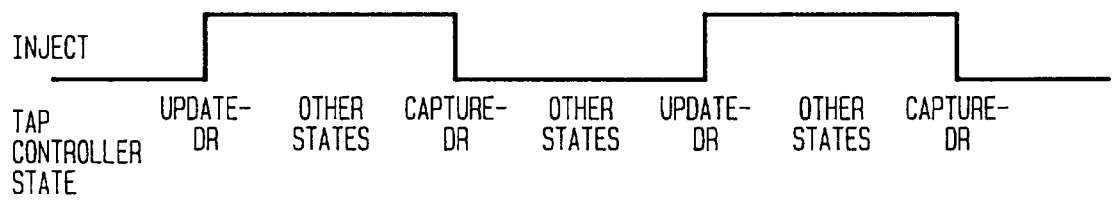
FIG. 3 shows an exemplary waveform for the INJECT control signal in accordance with the present invention.

If PINCONTROL is not in effect, both PINCONTROL_ACTIVE and INJECT assume a constant 0 and thus the functionality of the cell is the same as the traditional B-S cell 12. When PINCONTROL is in effect, PINCONTROL_ACTIVE will assume value 1 while INJECT will have a waveform as shown in FIG. 3. As can be seen, INJECT is raised to 1 only when the TAP controller (shown in FIG. 1) reaches the Update-DR state and remains 1 until Capture-DR is visited again for shifting in a new control pattern. (To be consistent with the EXTEST, INJECT will be raised to 1 on the falling edge of the TCK.) Therefore, during the shift operation, the output pins are controlled by the system logic and thus there is no rippling at output pins thereby solving one of the problems found in prior art implementations. It can also be seen that the clock to the UPD flip-flop 18 is gated by the inversion of PINCONTROL_ACTIVE so that it is not updated under PINCONTROL. Accordingly, the pattern for the UPD flip-flop 18 must be loaded using other instructions like PRELOAD, as would be understood by those skilled in the art.

Figure 4:
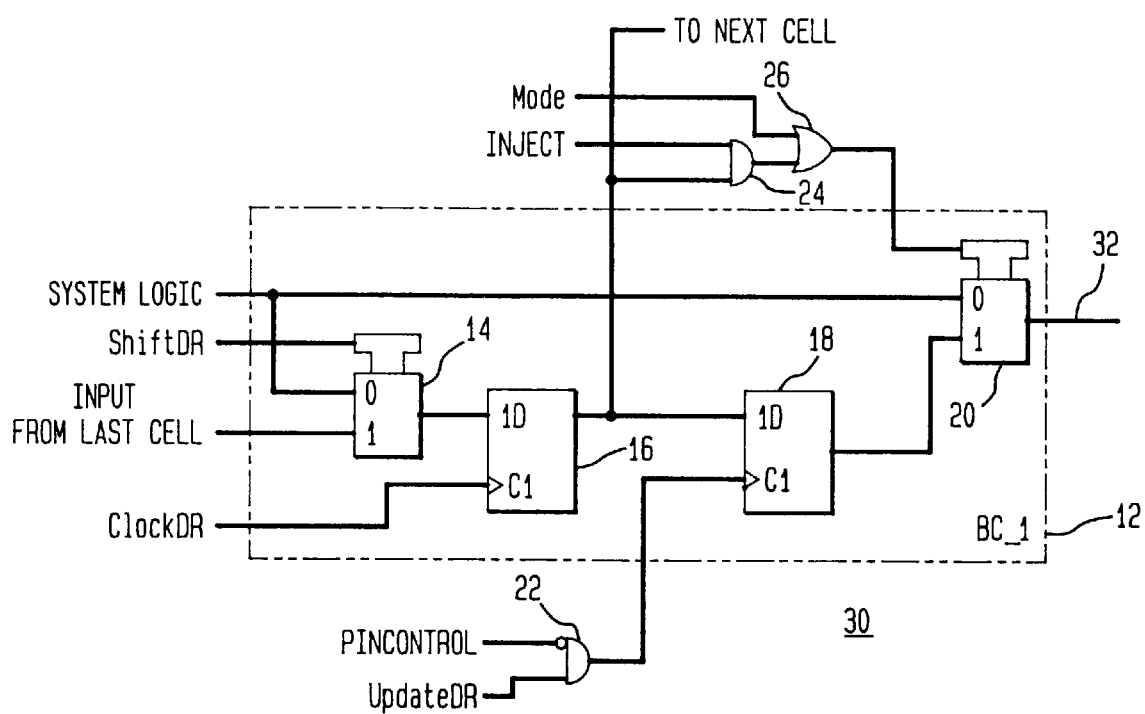
FIG. 4 shows an alternate embodiment for implementation of the hybrid pin control feature of the present invention for a 2-state output pin.

Referring to FIG. 4, an alternate embodiment of a modified B-S cell 30 is shown for a 2-state output pin which does not incorporate the High-Z state. Implementation is similar to the embodiment shown in FIG. 2 (where like reference numerals are used to designate like components), with the exception that one of the OR gates and the tri-state buffer are eliminated making the design somewhat simpler. Note that for this cell design, the output pin 32 is in the control of system logic when the CAP flip-flop 16 is 0, independent of the value of the UPD flip-flop 18.

Figure 5:
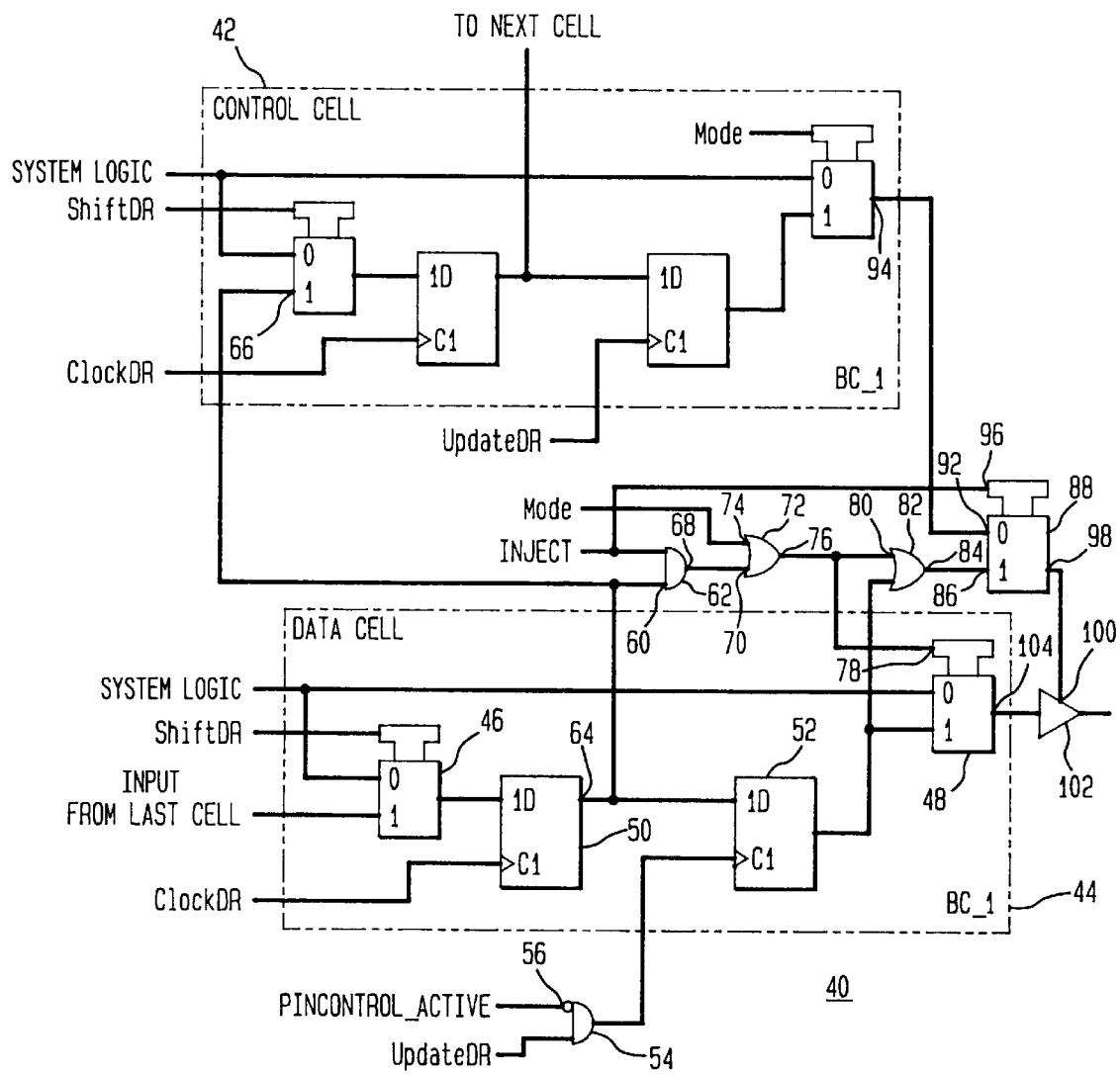
FIG. 5 shows an alternate embodiment for implementation of the hybrid pin control feature of the present invention for a 3-state output pin.

Referring to FIG. 5, there is shown an alternate embodiment of a B-S design for a three state pin 40 in accordance with the present invention. As shown, the 3-state pin 40 includes an unmodified B-S cell or control cell 42 which couples to a second modified cell or data cell 44. In a similar manner to the embodiment in FIG. 2, the data cell includes the basic architecture of a traditional B-S cell, i.e., input and output shift registers 46, 48 and a capture and update flip-flop 50, 52. As with the embodiment in FIG. 2, a first AND gate 54 receives the PINCONTROL_ACTIVE control signal (through an inverted input 56) and the Update-DR signal, the output of which drives the clock 58 of the UPD flip-flop 52. An input 60 of a second AND gate 62 is coupled to the output 64 of the CAP flip-flop 50 and also receives the INJECT control signal. This same output 64 from the CAP flip-flop 50 is also coupled to an input 66 of the input shift register in the control cell 42. The output 68 of the second AND gate 62 is coupled to an input 70 of a first OR gate 72, where the Mode control signal is coupled to the OR gate 72 as a second input 74. The output 76 of the first OR gate 72 is coupled to the shift control 78 of the output shift register 48 as well as an input 80 of a second OR gate 82. The second OR gate 82 also receives an input from the output of the UPD flip-flop 52. The output 84 of the second OR gate 82 is coupled to one input 86 of a tri-state control shift register 88, where this shift register also receives an input 92 from the output 94 of the output shift register of the control cell 42 and where the shift control input 96 is controlled by the INJECT control signal. The output 98 of the tri-state control shift register 88 is coupled to the tri-state control 100 of the output buffer 102 and the output 104 of the output shift register 48 is coupled to the input 104 of the tri-state output buffer 102. It will be noted that for the 3-state output pin 40, the control cell 42 is no longer controlling the data cell 44 when PINCONTROL is in effect as is shown in FIG. 5. Instead, the values in the CAP and UPD flip flops 50, 52 of the data cell 44 will determine whether the output is enabled or not. Since the PINCONTROL feature of the present invention is a user-defined instruction and since when it is not in effect, the B-S logic is fully compliant with the IEEE 1149.1 standard, users will not have to be concerned about the standard-compliance issue.

Since the B-S circuitry of the present invention can work in parallel with the system logic, faults may be injected when a system is running its normal functions. With conventional B-S logic, faults could only be injected to selected chips for all of their output pins. With the hybrid pin control feature, a user has a greater amount of flexibility in selecting faults to be injected. With the present invention, a single pin fault or a multifault with different combinations of fault types can be injected. Whenever it is known at which pins and what faults are to be injected, the patterns to be shifted into the cell or cells can then be computed. For example, from Table 1, it can be determined what patterns are to be loaded into the CAP and UPD flip-flops. As an example, let the patterns to be loaded into the CAP and UPD flip-flops be $P_c$ and $P_u$, respectively. The steps for injecting a fault can then be described as follows:

1. Execute a PRELOAD to load the UPD flip-flops with $P_u$.

2. Shift in PINCONTROL into the instruction registers. When the instruction is updated, PINCONTROL_ACTIVE is asserted and blocks the clock to UPD, and accordingly pattern $P_u$ is locked.

3. Shift in $P_c$ to the CAP flip flops. During the shifting, INJECT is still 0, therefore, the output pins are controlled by the system logic and will not be affected by the shifting.

4. After shifting in $P_c$, the TAP controller is moved to the Update-DR state and at the falling edge of the TCK, INJECT is asserted which activates the fault injection.

An injected fault will remain in place as long as the INJECT control signal remains asserted. As would be understood, the fault injection duration depends on the TMS sequence. From FIG. 2, INJECT remains asserted until the TAP controller enters the Capture-DR state again. During the fault injection period, the TAP controller may stay in RunTest/Idle state. A transient fault with a duration as short as 1.5 TCKs can be created by moving the TAP controller from the Update-DR to Select-DR-Scan and then to the Capture-DR state. To be consistent with EXTEST, which updates data at the falling edge of TCK, PINCONTROL also injects faults at the falling edge of TCK. This explains why a half TCK cycle is included in the injection duration. In fact, any fault injection period of (1.5+k) TCKs, where k is a non-negative integer, is possible with the present invention. In order to have a fault duration of (1.5+k), a TMS sequence should be applied to move the TAP controller from the Update-DR to Run-Test/Idle state and remain there for k TCKs and then move to the Select-DR-Scan and Capture-DR states. To move out of fault injection mode, the PINCONTROL instruction should be replaced with other instructions.

Figure 6:
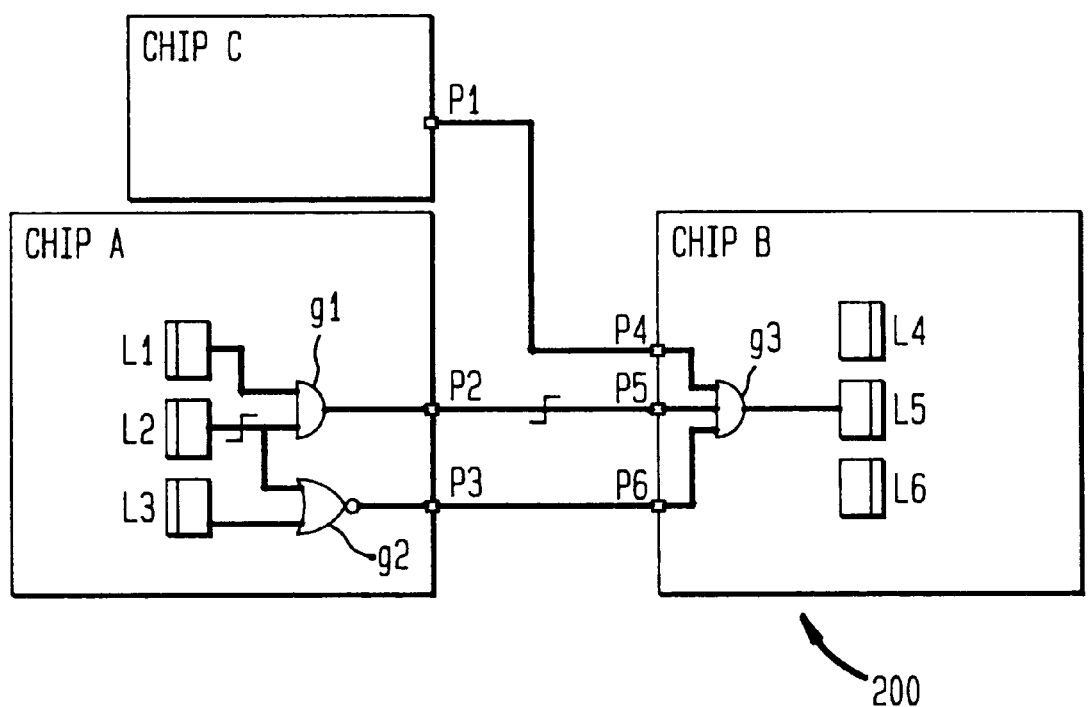
FIG. 6 shows an exemplary circuit for illustrating the additional testing capabilities as a result of utilizing the present invention.

The PINCONTROL feature of the present invention can also be used to improve fault coverage and simplify test generation for inter-chip path delay tests. For example, there are two common problems encountered in testing inter-chip paths delays: first is that deriving the delay test for the inter-chip path may involve logics of more than one chip and this information may be too complex to handle or may not be available; second, although the intra-chip path segments are delay testable, the overall inter-chip path may not be testable. As an example, consider the circuit 200 shown in FIG. 6. Suppose chip A and B are all tested for their path delays; that is, the delay of the path segments from latch L2 to pin P2 is verified to be within specification before chip A is mounted to a board. Similarly, the delay of the path segment from pin P5 to latch L5 is also verified. However, it cannot be determined if the delay of the path L2-P2-P5-L5 is within specification because the delay of the interconnect is to be included. In fact, the path L2-P2-P5-L5 is not actually delay-testable. For example, suppose it is desired to test the rising transition of the path, then a transition at latch L2 is created. To sensitize the path on gate g3, L3 must be 0. But if L3 is 0, a falling transition will appear at P6 and block the transition at P5. Thus, under prior art conditions, the path is not testable. If, however, P3 can be made to drive a constant 1 using the B-S cell, then the path the path can be tested. Note that pin P2 must be controlled by the system logic in order to propagate the delay. Therefore, a situation is encountered where one pin needs to be controlled by system logic while the other pin needs to be controlled by the B-S logic. This can be accomplished by utilizing the PINCONTROL feature of the present invention, as previously described.

Here, the B-S cell is being used to block an undesired transition and apply a non-controlling value. Note that B-S is being used as a supplemental means to aid inter-chip path delay testing and is not the sole means for applying the delay tests. In order to perform the delay test, it is necessary to control the chip clock and to have the ability to apply two-pattern tests either by scan or other means, as would be understood by a person skilled in the art.

Another advantage of using the PINCONTROL feature is that the chip-level path delay tests can be reused for testing interchip paths. Consider the example path of L2-P2-P5-L5 from FIG. 5 again. Suppose a two-pattern test $(V_1, V_2)$ is a chip-level path delay for testing the path segments L2-P2 of the chip A and $V_3$ is a chip-level vector that can sensitize path segment P5-L5 of chip B. By combining $(V_1, V_2)$ together with $(V_3, V_3)$, a test for L2-P2-P5-L5 can be formed. With the aid of B-S logic, one is able to apply the two set of patterns at the same time and eliminate the constraints imposed by connections between chips. Note that $(V_1, V_2)$ and $V_3$ can be pre-computed independent of board-level interconnections. With the aid of PINCONTROL, a set of pre-computed chip-level delay tests can be pieced together to form the inter-chip delay tests and thus eliminate the need to process the complex board level logics.

From the above, it should be understood that the embodiments described, in regard to the drawings, are merely exemplary and that a person skilled in the art may make variations and modifications to the shown embodiments without departing from the spirit and scope of the invention. All such variations and modifications are intended to be included within the scope of the invention as defined in the appended claims.

What is claimed is:

1. An apparatus for enabling individual control of functional input/output (I/O) pins in an integrated circuit which includes a boundary scan test architecture, said apparatus comprising:

at least one boundary scan cell coupled to ones of said functional input/output pins of said integrated circuit, said boundary scan cell including a capture flip-flop responsive to input signals and an update flip-flop responsive to an output of said capture flip-flop; and a set of logic gates coupled to said boundary scan cell, said set of logic gates including a first logic gate operable to receive a control signal and having an output coupled to a clock input of said update flip flop for blocking said clock input upon application of said control signal, wherein said I/O pin is alternately configurable, depending on content of said capture flip-flop when said control signal is applied to receive contents of said update flip-flop and to be controlled by system logic of said integrated circuit wherein said update flip-flop contents is either logic 0 or logic 1.

2. The apparatus of claim 1, wherein said first logic gate is an AND gate and said control signal and an Update-DR signal are inputs to said first logic gate.

3. The apparatus of claim 2, wherein said control signal is applied to an inverting input of said AND gate.

4. The apparatus of claim 1, further including an output shift register coupled to said update flip-flop, wherein said set of logic gates includes a logic gate combination having an input coupled to an output of said capture flip-flop and another input which is a second control signal, an output of said logic gate combination coupled to a control input of said output shift register.

5. The apparatus of claim 4, wherein said logic gate combination includes an AND gate and an OR gate, the output of said AND gate being an input to said OR gate, said OR gate receiving a Mode signal as a second input.

6. The apparatus of claim 4, further including a second logic gate having an input coupled to an output of said logic gate combination and an output coupled to a tri-state output buffer, wherein said output of said second logic gate couples to a control terminal of said tri-state output buffer to allow said functional pin to be driven into a high impedance state.

7. The apparatus of claim 6, wherein said second logic gate is an OR gate, said second logic gate further receiving as inputs said second control signal and an output of said update flip-flop.

8. The apparatus of claim 6, wherein said at least one boundary scan cell includes a control cell shift register input coupled to a data cell capture flip-flop output.

9. The apparatus of claim 8, further including a tri-state control shift register coupled between said output of said logic gate combination and said control terminal of said tri-state output buffer, said tri-state control shift register further having an input coupled to an output of said control cell.

10. The apparatus of claim 9, wherein said tri-state control shift register includes a control terminal coupled to said second control signal.

11. The apparatus of claim 4, wherein said second control signal is an INJECT control signal that is applied between Update-DR and Capture-DR states of a controller of said boundary scan cell.

12. A method of operating a boundary scan cell in an integrated circuit which includes a boundary scan test architecture for enabling individual control of functional input/output (I/O) pins in said integrated circuit, said boundary scan cell including a capture flip-flop and an update flip-flop, said method comprising:

providing a set of logic gates coupled to said boundary scan cell, said logic gates adapted to receive a control signal;

shifting a control instruction into an instruction register of said boundary scan test architecture in order to activate said control signal, said control signal operable to control said logic gates to block a clock input of said update flip-flop to lock in a pattern, $P_u$, in said update flip-flop and activating said control signal such that a functional pin of said integrated circuit corresponding to said boundary scan cell is alternately configurable, depending on a content of said capture flip-flop when said control signal is active to receive contents of said update flip-flop or to be controlled by system logic of said integrated circuit wherein said update flip-flop contents is logic 0 or logic 1.

13. The method of claim 12, further including the step of executing a load said update flip-flop to load said bit pattern, $P_u$, prior to activating said control signal.

14. The method of claim 12, further including the step of shifting in a bit pattern, $P_c$, to said capture flip-flop.

15. The method of claim 14, further including the step of asserting a second control signal after a controller of said boundary scan cell is moved to an update state, wherein said second control signal enables said functional pin to be driven according to said content of said capture flip-flop and said update flip-flop.

16. The method of claim 15, wherein said second control signal is an INJECT control signal that is asserted between Update-DR and Capture-DR states of a controller of said boundary scan cell.

17. The method of claim 12, wherein said functional pin is further configurable to be driven into a high impedance state.

* * * * *